United States Patent
Hamada et al.

[11] Patent Number: 5,723,860
[45] Date of Patent: Mar. 3, 1998

[54] FRAME-SUPPORTED PELLICLE FOR PHOTOMASK PROTECTION

[75] Inventors: Yuichi Hamada; Meguru Kashida, both of Gunma-ken, Japan

[73] Assignee: Shin-Etsu Chemical Co., Ltd., Tokyo, Japan

[21] Appl. No.: 673,257

[22] Filed: Jun. 28, 1996

[30] Foreign Application Priority Data

Jul. 5, 1995 [JP] Japan ................................. 7-169545

[51] Int. Cl.⁶ ............................................. H01J 5/02
[52] U.S. Cl. ................................. 250/239; 428/317.7
[58] Field of Search ......................... 250/239, 237 R; 428/14, 40.1, 40.2, 317.7, 46; 355/122; 257/431–434

[56] References Cited

U.S. PATENT DOCUMENTS 4,470,508  9/1984  Yen ................................. 428/40.1

OTHER PUBLICATIONS

Patent Abstracts of Japan vol. 18, No. 244, 10 May 1994 & JP-A-06-027644 (Seiko Epson Corp), 4 Feb. 1994 (Abstract).
Patent Abstracts of Japan vol. 17, No. 543, 29 Sep. 1995 & JP-A-05 150446 (Matsushita Electron Corp.) 18 Jun. 1993.
Patent Abstracts of Japan vol. 17, No. 194, 15 Apr. 1993 & JP-A-04 342257 (Ricoh) 27 Nov. 1992 (Abstract).
Patent Abstracts of Japan vol. 16, No. 559, 30 Nov. 1992 & JP-A-04 212958 (Nikon Corp.) 4 Aug. 1992 (Abstract).
Patent Abstracts of Japan vol. 13, No. 104, 13 Mar. 1989 & JP-A-63 284551 (Mitsubushi Electric) 21 Nov. 1988 (Abstract).
Patent Abstracts of Japan vol. 13, No. 422, 20 Sep. 1989 & JP-A-01 154062 (Seiko Epson Corp.) 16 Jun. 1989 (Abstract).

*Primary Examiner*—Que Le
*Attorney, Agent, or Firm*—McAulay Fisher Nissen Goldberg & Kiel, LLP

[57] ABSTRACT

Proposed is an improvement in a frame-supported pellicle, which is a device for dust-proof protection of a photomask used in the photolithographic patterning works in the manufacture of fine electronic devices, consisting of a rigid pellicle frame, a highly transparent membrane of a plastic resin spread over and adhesively bonded to one end surface of the pellicle frame in a slack-free fashion and a layer of a pressure-sensitive adhesive formed on the other end surface of the pellicle frame to facilitate mounting of the frame-supported pellicle on the surface of a photomask and to secure the same at the correct position. The improvement comprises forming the layer of the pressure-sensitive adhesive on the end surface of the pellicle frame to have an outwardly convex surface, for example, in the form of a barrel vault instead of the flat surface in the prior art so that the troubles in the prior art due to occurrence of air gaps between the surface of the adhesive layer and the surface of the photomask unavoidable in mounting of the conventional frame-supported pellicle can be prevented to ensure completely air-tight sealing thereby. The adverse influence on the pellicle membrane due to the air-tightness of sealing by the pressure difference between the outer and inner surfaces can be overcome by providing a penetrating opening for air escape in the pellicle frame covered with a filter sheet.

6 Claims, 3 Drawing Sheets

FRAME-SUPPORTED PELLICLE FOR PHOTOMASK PROTECTION

BACKGROUND OF THE INVENTION

The present invention relates to a frame-supported pellicle for dust-proof protection of a photomask in the photolithographic patterning works in the manufacture of fine electronic devices such as semiconductor devices and liquid crystal display panels. More particularly, the invention relates to an improvement in a frame-supported pellicle used for the dust-proof protection of a photomask as mounted and secured thereon by means of a pressure-sensitive adhesive.

As is well known, the manufacturing process of various kinds of fine electronic devices including semiconductor devices such as LSIs, VLSIs and the like and liquid crystal display panels involves a step of photolithographic patterning in which a photoresist layer formed on the surface of a substrate such as a semiconductor single crystal silicon wafer and the like is exposed patternwise to ultraviolet light through a pattern-bearing photomask which is a transparency of a fused silica glass having a positive or negative pattern of the images to be reproduced in the photoresist layer. Needless to say, the pattern-bearing photomask in this patternwise exposure to ultraviolet light must be absolutely clean and dust-free because any dust particles deposited on the photomask cause serious degradation in the quality of the pattern reproduction. Accordingly, photolithographic patterning works are conducted-usually in a clean room in which the atmospheric air is freed from dust particles as far as possible. It is, however, a very difficult matter to ensure absolutely dust-free conditions even in a clean room of the highest class so that the usual practice undertaken is to mount a frame-supported pellicle on the photomask and the patternwise exposure of the photoresist layer is conducted by the ultraviolet light after passing through the pellicle membrane.

A frame-supported pellicle is a device consisting of a frame of a rigid material, such as aluminum, stainless steel, polyethylene and the like, referred to as a pellicle frame hereinafter, having parallel end surfaces and a thin film of a plastic resin having high transparency to ultraviolet light, such as nitrocellulose, cellulose acetate and the like, referred to as a pellicle membrane hereinafter, spread over and adhesively bonded to one end surface of the pellicle frame in a slack-free fashion by using an adhesive. When a frame-supported pellicle is mounted on the photomask and the patternwise exposure for the photolithographic patterning is conducted with the ultraviolet light passing through the pellicle membrane and focused to the pattern on the photomask below the pellicle membrane, dust particles deposited on the pellicle membrane have little adverse influences on the quality of pattern reproduction thus to exhibit an effect of dust-free protection of the photomask.

In conducting the above described ultraviolet exposure through a pellicle membrane, the frame-supported pellicle must be mounted and secured at a correct position on the photomask so that it is usual that a pressure-sensitive adhesive layer is provided, as is illustrated in FIGS. 3 and 4 by an enlarged partial cross section,on the end surface of the pellicle frame 1A opposite to the end surface to which the pellicle membrane 2 is adhesively bonded and the frame-supported pellicle is secured on the photomask 5 by means of the pressure-sensitive adhesive 3A. The pressure-sensitive adhesive layer 3A before use of the pellicle is temporarily protected by attaching a releasable sheet of paper 4 which is removed just before using the frame-supported pellicle. In mounting of a frame-supported pellicle having a pressure-sensitive adhesive layer 3A on a photomask 5, troubles are sometimes caused due to occurrence of a gap space called an air path or air pool 8 between the surface of the photomask 5 and the surface of the pressure-sensitive adhesive layer 3A because of the difficulty in perfectly attaching the adhesive layer 3A to the surface of the photomask 5. When such an air path occurs between the photomask surface and the pressure-sensitive adhesive layer 3A on the lower end surface of the pellicle frame 1A, intrusion of dust particles from outside is unavoidable as accompanying the air flow therethrough resulting in deposition of the dust particles on the photomask 5. An air pool 8, which in itself does not communicate the space surrounded by the frame-supported pellicle with the outer atmosphere, sometimes grows to be an air path.

It is a practice usually undertaken in order to solve the above described problem due to incomplete adhesive bonding of a pellicle frame to the photomask surface that the pellicle frame mounted on the photomask is pressed against the photomask under a load of, for example, 30 kg or larger to exclude the air between the surfaces. This pressing method, however, is sometimes accompanied by a risk of eventual cracking of the photomask to cause a very serious economical loss due to the expensiveness of photomasks.

With an object to reduce the pressure for air path-free bonding of a frame-supported pellicle to the photomask surface, an attempt has been made to use a soft and readily deformable pressure-sensitive adhesive. This method of using a soft adhesive, however, is not without problems because, when the adhesive is soft enough so as to satisfy the requirements for the adhesive mounting of the frame-supported pellicle onto the photomask surface under a relatively low contacting pressure, the frame-supported pellicle once mounted on the photomask at the correct position is subject to displacement due to the excessively high plastic deformability of the pressure-sensitive adhesive.

SUMMARY OF THE INVENTION

The present invention accordingly has an object to provide a novel and improved frame-supported pellicle for dust-proof protection of a photomask used in the photolithographic patterning works for the manufacture of free electronic devices, by which the above described problems and disadvantages in the prior art relative to the pressure-sensitive adhesive layer can be overcome.

Thus, the present invention provides an improvement, in a frame-supported pellicle consisting of: (a) a pellicle frame of a rigid material having two opposite parallel end surfaces; (b) a transparent pellicle membrane of a plastic resin film spread over and adhesively bonded to one of the end surfaces of the pellicle frame in a slack-free fashion; and (c) a layer of a pressure-sensitive adhesive formed on the other end surface of the pellicle frame, which comprises having the layer of the pressure-sensitive layer of which the surface is outwardly convex, for example, in the form of a barrel vault, so that an air-tight condition of sealing can be easily obtained between the photomask surface and the pressure-sensitive adhesive layer.

In order to prevent possible troubles due to the high hermeticity of the space surrounded by the frame-supported pellicle and the photomask to cause an unbalance between the pressures on both surface of the pellicle membrane, a remedial means is proposed to provide the pellicle frame with an opening for air escape covered with an air-permeable filter sheet impermeable to dust particles.

DETAILED DESCRIPTION OF THE PREFERRED EMBODIMENTS

Figure 3:
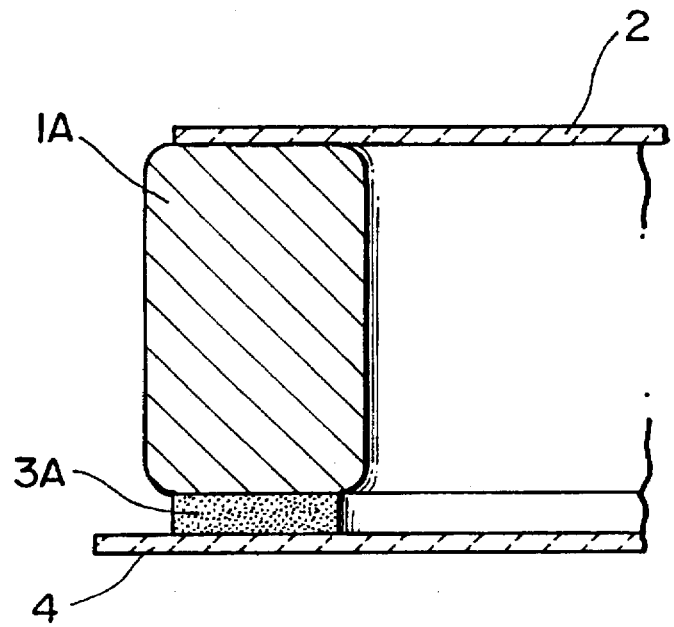
FIG. 3 is an enlarged partial cross sectional view of a conventional frame-supported pellicle having a pressure-sensitive adhesive layer of a flat surface as protected temporarily with a releasable sheet.
Figure 4:
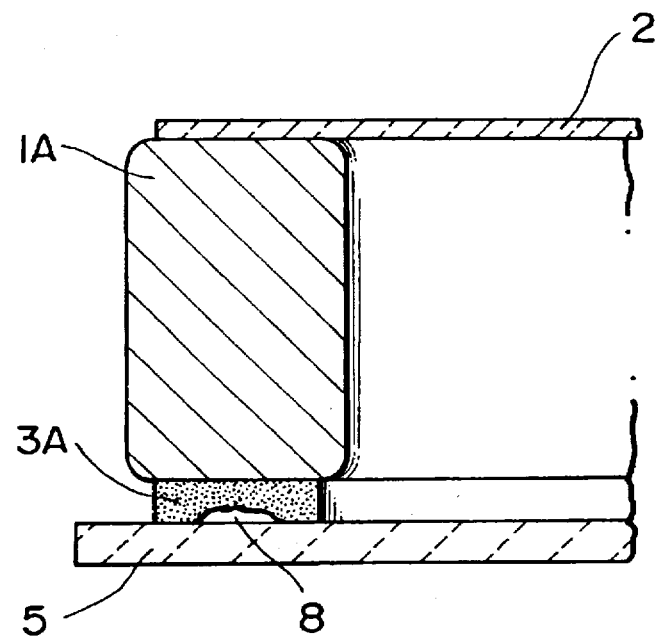
FIG. 4 is an enlarged partial cross sectional view of the conventional frame-supported pellicle of FIG. 3 mounted on a photomask. An air pool is formed between the pressure-sensitive adhesive layer and the photomask surface.

As is illustrated in FIG. 3 by a partial cross sectional view, a frame-supported pellicle consisting of a rigid pellicle frame 1 and a thin transparent film 2 of a plastic resin spread over and adhesively bonded to one of the end surfaces of the pellicle frame 1A in a slack-free fashion. A layer 3A of a pressure-sensitive adhesive is formed on the other end surface of the pellicle frame 1A while it is usual in the prior art that the pressure-sensitive adhesive layer 3A, which is temporarily protected by attaching a releasable sheet 4, is formed in such a fashion that the surface thereof is as flat and smooth as possible. In mounting of the conventional frame-supported pellicle on the surface of a photomask 5 as is illustrated in FIG. 4, the flat surface of the pressure-sensitive adhesive layer 3A of a large contacting area is brought into contact with the flat surface of the photomask 5 at one time so that an air pool 8 is sometimes formed between the surfaces of the pressure-sensitive adhesive layer 3A and the photomask 5 to cause troubles due to occurrence of an air path or air pool 8 as is mentioned above. Once such an air pool 8 is formed between the surfaces, it is almost impossible to completely remove the air pool 8 by increasing the contacting pressure on the pellicle frame 1A provided that the pressing force is around 10 kg and complete elimination of air pools 8 is possible only by increasing the pressing force to exceed 30 kg with a risk of destroying the expensive photomask 5.

Figure 1:
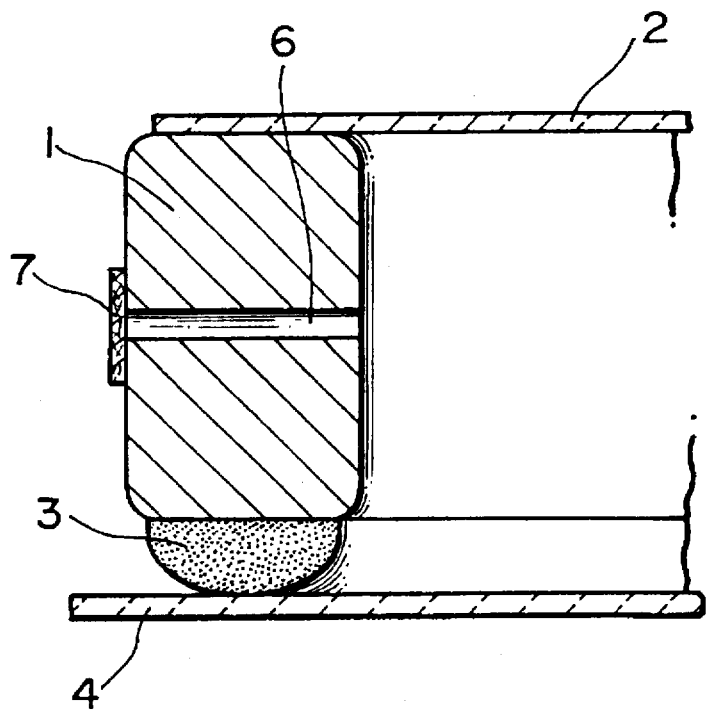
FIG. 1 is an enlarged partial cross sectional view of the inventive frame-supported pellicle having a pressure-sensitive adhesive layer of a cross section of barrel vault as protected temporarily with a releasable sheet.

The above described problem in the prior art can be solved with the inventive frame-supported pellicle illustrated in FIG. 1, in which the surface of the pressure-sensitive adhesive layer 3 is not flat but outwardly convex or, typically, in the form of a barrel vault as shown although the cross sectional profile of the pressure-sensitive adhesive layer 3 is not limited to the form of a sector head having a semi-contour of a barrel vault as is shown in FIG. 1 but can be oval.

Figure 5:
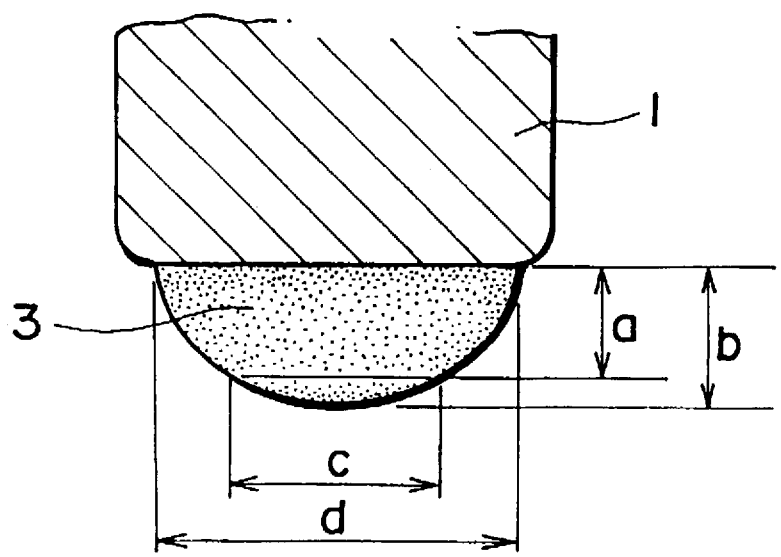
FIG. 5 is an enlarged partial cross sectional view of the pellicle frame and the pressure-sensitive adhesive layer of the invention for the illustration of the curvature of the adhesive layer surface.

When the surface of the outwardly convex pressure-sensitive adhesive layer 3 is in the form of a barrel vault, the outward convexity thereof is preferably such as described below by making referrence to FIG. 5. Assume that the layer of the pressure-sensitive adhesive layer 3 has a base width, i.e. the width of the adhering surface to the end surface of the pellicle frame 1, and a maximum height b, then the intermediate width c, referred to as the 90%-height width hereinafter, measured at an intermediate height a which is 90% of the maximum height b, is preferably in the range from 80% to 95% of the base width d.

Figure 2:
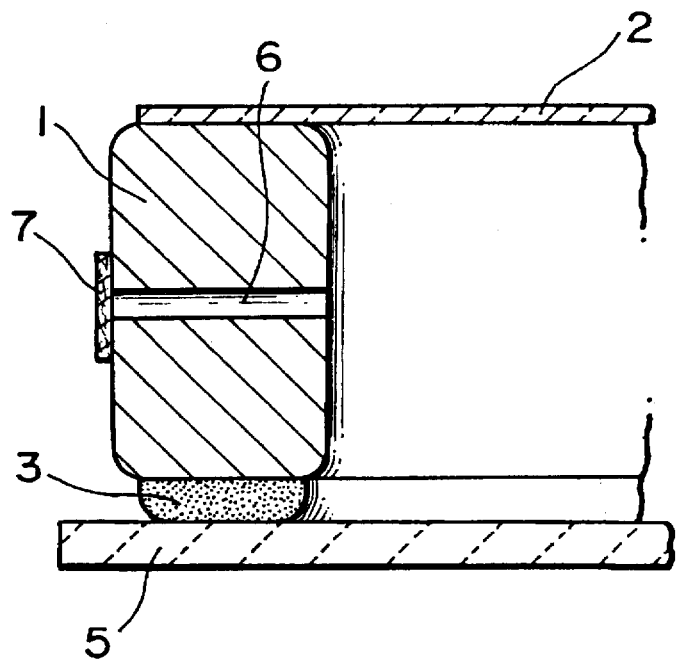
FIG. 2 is an enlarged partial cross sectional view of the inventive frame-supported pellicle of FIG. 1 mounted on a photomask.

When the inventive frame-supported pellicle with a pressure-sensitive adhesive layer 3 having an outwardly convex surface is put on the surface of a photomask 5, contacting of the surface first takes place on the lowermost line of the vault-formed surface of the adhesive layer 3 with little chance to form an air pool and the contacting area between the surfaces is successively increased by the increase of the contacting pressure resulting in flattening of the surface of the pressure-sensitive adhesive layer 3 without formation of an air pool as is illustrated in FIG. 2 so that a complete sealing condition can be obtained with a relatively small pressing force as compared with the conventional frame-supported pellicle illustrated in FIGS. 3 and 4. For example, a complete air-tight sealing condition can be obtained with a pressing force of 10 kg or even smaller. The thickness of the pressure-sensitive adhesive layer 3 after flattening of the outwardly convex surface thereof as is illustrated in FIG. 2 is usually 90% or smaller of the thickness before flattening of the surface as is illustrated in FIG. 1 so that the sealing effect by the adhesive layer 3 is complete.

As a consequence of the complete sealing effect by the pressure-sensitive adhesive layer 3 according to the invention when the frame-supported pellicle of the invention is mounted on and adhesively bonded to the surface of a photomask 5, a trouble is sometimes encountered in mounting of the pellicle and subsequent use of the pellicle-bearing photomask 5 because the air confined in the space surrounded by the photomask 5 and the frame-supported pellicle has no escape so as to cause an unbalance of pressure between the surfaces of the pellicle membrane 2 which is initially in a slack-free condition due to an increase in the pressure of the space. This phenomenon of a slack in the pellicle membrane 2 can be prevented by providing the pellicle frame 1 with an opening 6 to serve as an air escape, which, however, must be covered with a filter sheet 7 in order to prevent intrusion of dust particles from outside. When an air escape opening is formed in the pellicle frame, the 90%-height width c of the pressure-sensitive adhesive layer can be in the range from 40% to 95% of the base width d.

In the following, the improvement according to the invention is illustrated in more detail by way of Examples and a Comparative Example.

EXAMPLE 1

A square aluminum frame having an anodized surface was prepared, of which the lengths of the outer side and inner side were 120 mm and 110 mm, respectively, and the height, i.e. the distance between the end surfaces, was 6.3 mm.

One of the end surfaces of the pellicle frame was coated with a silicone-based pressure-sensitive adhesive (KR 120, a product by Shin-Etsu Chemical Co.) followed by heating for 30 minutes at a temperature of 120° C. to effect semi-curing of the adhesive. The adhesive layer had a surface in the form of a barrel vault having a height of 0.6 mm along the center line, a base width of 1.60 mm and a 90%-height width of 1.44 mm. Thereafter, the other end surface of the pellicle frame was coated with an amorphous fluorocarbon-based resin (Saitop Type CTX-A, a product by Asahi Glass Co.) in a thickness of 0.1 mm.

Further, the inside surface of the pellicle frame was coated with the same pressure-sensitive adhesive as above in a thickness of 0.05 mm to serve as a dust capturing layer. A 1.62 μm thick film of a fluorocarbon-based resin (Saitop Type CTX-S, a product by Asahi Glass Co.) as a pellicle membrane prepared separately was adhesively bonded at 108° C. by melt-bonding to the end surface of the pellicle frame coated with the fluorocarbon-based resin to complete a frame-supported pellicle having a pressure-sensitive adhesive layer.

In the next place, the above prepared frame-supported pellicle was put on a photomask of fused silica glass and pressed down under a load of 10 kg so that the frame-supported pellicle could be firmly secured at the position. The layer of the pressure-sensitive adhesive between the pellicle frame and the photomask surface had a reduced thickness of 0.5 mm and no air paths nor air pools could be detected between the surfaces. When the frame-supported pellicle was put on the photomask and pressed under a load of 10 kg, the pellicle membrane was slightly expanded outwardly but the initial flat and slack-free condition of the pellicle membrane could be regained within 10 minutes.

EXAMPLE 2

The experimental procedure was substantially the same as in Example 1 described above except that an air escape opening of 0.5 mm diameter was formed on the center of one of the four sides of the pellicle frame and the air escape opening was covered by attaching a 10 mm by 5 mm wide filter sheet of polytetrafluoroethylene having a pore diameter of 0.5 μm from outside as is illustrated in FIG. 1. The layer of the pressure-sensitive adhesive had a base width of 1.66 mm maximum height of 0.60 mm and 90%-height width of 1.35 mm.

The results of mounting of this frame-supported pellicle on a photomask were quite satisfactory without occurrence of any air paths and air pools as well as no outward slackening of the pellicle membrane due to unbalance of the pressures.

Comparative Example

A frame-supported pellicle having a layer of a pressure-sensitive adhesive was prepared in just the same manner as in Example 1 described above except that the layer of the pressure-sensitive adhesive formed on one end surface of the pellicle frame had a width of 1.60 mm and a uniform thickness of 0.30 mm with a flat surface.

The thus prepared frame-supported pellicle was put on the surface of a photomask and pressed thereto under a load of 10 kg. However, the air-tight sealing between the pellicle frame and the photomask was incomplete due to gap spaces such as air paths formed between the surfaces. Completely air-tight sealing conditions could be accomplished by the exclusion of air gaps only by increasing the pressing load to 30 kg at a risk of break of the photomask along with outward slackening of the pellicle membrane which could not regain the initial slack-free condition even after 10 minutes.

What is claimed is:

1. In a frame-supported pellicle for dust-free protection of a photomask used in a photolithographic patterning work consisting of:

(a) a pellicle frame of a rigid material having two opposite parallel end surfaces;
   (b) a transparent pellicle membrane of a plastic resin spread over and adhesively bonded to one of the end surfaces of the pellicle frame in a slack-free fashion; and
   (c) a layer of a pressure-sensitive adhesive formed on the other end surface of the pellicle frame, the improvement which comprises having the layer of the pressure-sensitive adhesive layer of which the surface is outwardly convex.

2. The improvement as claimed in claim 1 in which the layer of a pressure-sensitive adhesive formed on the end surface of the pellicle frame has a cross section with a contour of barrel vault.

3. The improvement as claimed in claim 2 in which the layer of the pressure-sensitive adhesive formed on the end surface of the pellicle frame and having a cross section with a contour of barrel vault has an intermediate width as measured at a height which is 90% of the maximum height of the layer from the contacting surface with the pellicle frame is in the range from 80% to 95% of the base width of the layer.

4. In a frame-supported pellicle for dust-free protection of a photomask used in a photolithographic patterning work consisting of:

(a) a pellicle frame of a rigid material having two opposite parallel end surfaces;
   (b) a transparent pellicle membrane of a plastic resin spread over and adhesively bonded to one of the end surfaces of the pellicle frame in a slack-free fashion; and
   (c) a layer of a pressure-sensitive adhesive formed on the other end surface of the pellicle frame, the improvement which comprises having the layer of the pressure-sensitive adhesive layer of which the surface is outwardly convex and having a pellicle frame provided with at least one air escape opening covered with an air-permeable filter sheet impermeable to dust particles.

5. The improvement as claimed in claim 4 in which the layer of a pressure-sensitive adhesive formed on the end surface of the pellicle frame has a cross section with a contour of barrel vault.

6. The improvement as claimed in claim 5 in which the layer of the pressure-sensitive adhesive formed on the end surface of the pellicle frame and having a cross section with a contour of barrel vault has an intermediate width as measured at a height which is 90% of the maximum height of the layer from the contacting surface with the pellicle frame is in the range from 40% to 95% of the base width of the layer.

* * * * *